United States Patent
Shahoian

(10) Patent No.: US 9,033,740 B2
(45) Date of Patent: May 19, 2015

(54) INTERPOSER CONNECTORS

(75) Inventor: Erik J. Shahoian, Orinda, CA (US)

(73) Assignee: Apple Inc., Cupertino, CA (US)

( * ) Notice: Subject to any disclaimer, the term of this patent is extended or adjusted under 35 U.S.C. 154(b) by 202 days.

(21) Appl. No.: 13/455,112

(22) Filed: Apr. 24, 2012

(65) Prior Publication Data

US 2012/0302095 A1    Nov. 29, 2012

Related U.S. Application Data

(60) Provisional application No. 61/478,884, filed on Apr. 25, 2011.

(51) Int. Cl.
*H01R 13/648*    (2006.01)
*H01R 13/6594*   (2011.01)
*H01R 13/6581*   (2011.01)

(52) U.S. Cl.
CPC ........ *H01R 13/6594* (2013.01); *H01R 13/6581* (2013.01)

(58) Field of Classification Search
USPC .......... 439/66, 73, 607.35, 607.36, 607.4, 67
See application file for complete search history.

(56) References Cited

U.S. PATENT DOCUMENTS

| | | | |
|---|---|---|---|
| 4,935,696 A | 6/1990 | DiPerna | |
| 4,948,379 A * | 8/1990 | Evans | 439/329 |
| 5,348,488 A | 9/1994 | Green et al. | |
| 5,383,787 A * | 1/1995 | Switky et al. | 439/67 |
| 5,462,441 A * | 10/1995 | Renn et al. | 439/67 |
| 5,653,600 A * | 8/1997 | Ollivier | 439/73 |
| 5,726,433 A | 3/1998 | Peng | |
| 5,729,433 A | 3/1998 | Mok | |
| 5,759,047 A | 6/1998 | Brodsky et al. | |
| 5,810,607 A * | 9/1998 | Shih et al. | 439/66 |
| 5,950,070 A | 9/1999 | Razon et al. | |
| 5,984,691 A | 11/1999 | Brodsky et al. | |
| 6,303,992 B1 | 10/2001 | Van Pham et al. | |
| 6,354,844 B1 | 3/2002 | Coico et al. | |
| 6,384,311 B1 | 5/2002 | Cota | |
| 6,384,331 B1 | 5/2002 | Ku | |
| 6,477,058 B1 | 11/2002 | Luebs et al. | |
| 6,483,043 B1 | 11/2002 | Kline | |
| 6,493,233 B1 | 12/2002 | De Lorenzo et al. | |
| 6,541,989 B1 | 4/2003 | Norris et al. | |

(Continued)

OTHER PUBLICATIONS

Display Port, Wikipedia, the free encyclopedia, 4 pages; printed on Aug. 29, 2008 from http://en.wikipedia.org/wiki/Displayport; page states it was last modified on Aug. 25, 2008.

(Continued)

*Primary Examiner* — Neil Abrams
*Assistant Examiner* — Travis Chambers
(74) *Attorney, Agent, or Firm* — Kilpatrick Townsend & Stockton LLP

(57) ABSTRACT

High-speed interposer connectors that may be space-efficient, reliable, and may be readily manufactured. One example may provide an interposer connector that may be particularly space-efficient in a vertical direction by using an interposer to form an electrical connection between conductors and a main-logic board or other appropriate substrate. Another example may provide a reliable connection between conductors and a main-logic board by using fasteners to fix an interposer to the main-logic board. Another example may provide connectors that are well-suited to handling high-speed signals by providing a shield to at least partially cover a top of an interposer connector.

21 Claims, 10 Drawing Sheets

(56) References Cited

U.S. PATENT DOCUMENTS

| | | |
|---|---|---|
| 6,710,611 B2 | 3/2004 | Saulnier et al. |
| 6,882,169 B2 | 4/2005 | Maruyama et al. |
| 6,927,083 B2 | 8/2005 | Kline |
| 6,933,617 B2 | 8/2005 | Pierce |
| 6,967,494 B2 | 11/2005 | Kline |
| 7,017,258 B2 | 3/2006 | Eckblad et al. |
| 7,029,289 B2 * | 4/2006 | Li .................................. 439/66 |
| 7,894,172 B2 | 2/2011 | Pan et al. |
| 7,944,200 B2 | 5/2011 | Endo et al. |
| 8,708,729 B2 * | 4/2014 | An et al. ....................... 439/331 |
| 2004/0060733 A1 | 4/2004 | Brodsky |
| 2004/0165366 A1 | 8/2004 | Schnabel et al. |
| 2004/0196682 A1 | 10/2004 | Funaba et al. |
| 2004/0259332 A1 | 12/2004 | Fukuoka et al. |
| 2005/0079748 A1 | 4/2005 | Kim |
| 2005/0237074 A1 | 10/2005 | Karavakis et al. |
| 2005/0286238 A1 | 12/2005 | Joy |
| 2006/0038287 A1 | 2/2006 | Hamasaki et al. |
| 2006/0186096 A1 | 8/2006 | Schramm |
| 2006/0244475 A1 | 11/2006 | Kirby et al. |
| 2006/0284309 A1 | 12/2006 | Park et al. |
| 2007/0200222 A1 | 8/2007 | Ehmke et al. |
| 2007/0212200 A1 | 9/2007 | Ueda et al. |
| 2007/0222339 A1 | 9/2007 | Lukacs et al. |
| 2008/0020596 A1 | 1/2008 | Hougham et al. |
| 2008/0158746 A1 | 7/2008 | Anthony et al. |
| 2008/0160681 A1 | 7/2008 | Anthony et al. |
| 2008/0318348 A1 | 12/2008 | Grupen-Shemansky |
| 2009/0040739 A1 | 2/2009 | Hamasaki et al. |
| 2009/0278246 A1 | 11/2009 | Hoshino et al. |
| 2010/0105221 A1 | 4/2010 | Miyamoto |
| 2010/0294358 A1 | 11/2010 | Nakanishi et al. |
| 2011/0019383 A1 | 1/2011 | Aoyama et al. |
| 2012/0104543 A1 | 5/2012 | Shahoian |
| 2012/0206892 A1 | 8/2012 | Shahoian et al. |
| 2013/0148322 A1 | 6/2013 | Fosnes et al. |

OTHER PUBLICATIONS

Dopplinger, A., et al. "Using IEEE 1588 for synchronization of network-connected devices", Mar. 29, 2007, from www.embedded.com/columns/technicalinsights/, 7 pages.

Ethernet, Wikipedia, the free encyclopedia, 9 pages; printed on Aug. 17, 2008, from http://en.wikipedia.org/wiki/Ethernet; page states it was last modified on Aug. 17, 2008.

IDT 24-Lane 3-Port PCI Express, 89HPES24N3 Data Sheet, Jul. 18, 2006, 30 pages.

IEEE 1394 interface, Wikipedia, the free encyclopedia, 7 pages; printed on Jul. 24, 2008 from http://en.wikipedia.org/wiki/Firewire; page states it was last modified on Jul. 23, 2008.

PCI Express Architecture, Chapter 3, Address Spaces & Transaction Routing, from PCIEX.book, pp. 105-152, Aug. 5, 2003.

PCI Express Base Specification Revision 1.0a, Apr. 15, 2003, pp. 1-426.

PCI Express, Wikipedia, the free encyclopedia, 11 pages; printed on Jul. 24, 2008 from http://en.wikipedia.org/wiki/PCI-Express; page states it was last modified on Jul. 16, 2008.

PCI-X, Wikipedia, the free encyclopedia, 4 pages; printed on Sep. 9, 2008 from http://en.wikipedia.org/wiki/PCI-X; page states it was last modified on Sep. 4, 2008.

Peer-to-peer, Wikipedia, the free encyclopedia, 11 pages; printed on Jul. 24, 2008 from http://en.wikipedia.org/wiki/Peer-to-peer; page states it was last modified on Jul. 24, 2008.

Peripheral Component Interconnect, Wikipedia, the free encyclopedia, 7 pages; printed on Jul. 24, 2008, from http://en.wikipedia.org/wiki/PCI_%28bus%29; page states it was last modified on Jul. 23, 2008.

Universal Serial Bus, Wikipedia, the free encyclopedia, 17 pages; printed on Jul. 24, 2008 from http://en.wikipedia.org/wiki/USB; page states it was last modified on Jul. 23, 2008.

VESA DisplayPort Standard, Version 1, Revision 1a, Jan. 11, 2008, 238 pages.

Non-Final Office Action mailed on Dec. 6, 2013 for U.S. Appl. No. 13/370,276, 18 pages.

Non-Final Office Action mailed on Sep. 9, 2013 for U.S. Appl. No. 13/249,260, 21 pages.

Final Office Action mailed on May 15, 2014 for U.S. Appl. No. 13/370,276, 23 pages.

Final Office Action mailed on Apr. 15, 2014 for U.S. Appl. No. 13/249,260, 34 pages.

Non-Final Office Action mailed on Sep. 11, 2014 for U.S. Appl. No. 13/492,895, 17 pages.

Final Office Action mailed on Feb. 12, 2015 for U.S. Appl. No. 13/492,895, 17 pages.

* cited by examiner

INTERPOSER CONNECTORS

CROSS-REFERENCES TO RELATED APPLICATIONS

This application claims the benefit of U.S. provisional patent application No. 61/478,884, filed Apr. 25, 2011, which is incorporated by reference.

BACKGROUND

Electronic devices have become ubiquitous the past several years. The number and types of portable computing devices, tablet, desktop, and all-in-one computers, cell, smart, and media phones, storage devices, portable media players, navigation systems, monitors and other devices has increased tremendously and this increase shows no signs of abating.

These electronic devices often share power and data between each other using a cable. These cables may have a connector plug on each end that mates with connector receptacles on the electronic devices. These cables may be left in place for long periods of time, or it may be desirable to disconnect the cable, for example if the cable is not needed for the operation of the device, or if the device is to be moved.

Some devices are not useful, or have limited usefulness, when they are not connected through a cable to another device. In such cases, particularly when the device is large and not particularly portable, it may be unimportant that a cable may be disconnected.

In these situations, the cable may be directly connected to the device. That is, it may be integrated with the device. Such a device may be referred to as a tethered device. This may save on costs, since a connector plug and receptacle are not needed. Tethering a device may reduce its size, since a cable may be smaller than a receptacle. It may also provide an enhanced user experience, since the cable cannot become detached and misplaced.

But it may be difficult to connect a cable to a device in this way. For example, the cable may carry several high-frequency signals. If these signals are not properly shielded, they may generate noise in the form of electromagnetic interference (EMI). Also, simple approaches, such as soldering cable conductors to a main, motherboard, or other printed circuit board, may be undesirable, since such connections may be unreliable and may reduce manufacturing yield.

Also, space in these devices may be at a premium. For example, many electronic devices may be very thin, such that a thick connection is impractical.

Thus, what is needed are connectors that may provide high-speed connectors that may be space-efficient, reliable, and may be readily manufactured.

SUMMARY

Accordingly, embodiments of the present invention may provide high-speed interposer connectors that may be space-efficient, reliable, and may be readily manufactured. An exemplary embodiment of the present invention may provide an interposer connector that may be particularly space efficient in a vertical direction. This interposer connector may include first contacts on a top side and second contacts on a bottom side. The first contacts may electrically connect to the second contacts. The first contacts may be arranged to be soldered or otherwise fixed to conductors, such as conductors in a cable. The second contacts may be arranged to mate with third contacts on a main-logic board, motherboard, or other appropriate substrate.

In various embodiments of the present invention, the first, second, and third contacts may be pads, spring contacts, or other types of contacts. In a specific embodiment of the present invention, at least some of the contacts may be formed using a plurality of small, spring-like contacts. In a specific embodiment of the present invention, the first contacts on the top of the interposer may be formed as pads (typically plated areas), the second contacts on the bottom of the interposer may each be formed of a plurality of small, spring-like contacts, while the third contacts on a main-logic board may be formed as pads. By connecting the spring-like contacts of the second contacts to the plated pads of the third contacts, reliable electrical connections may be made. Using an interposer to form an electrical connection between conductors and a main-logic board may result in a space-efficient connector.

Another illustrative embodiment of the present invention may provide a reliable connection between an interposer and a main-logic board (or other appropriate substrate). In a specific embodiment of the present invention, openings or holes in an interposer are configured to align with openings or holes in a main-logic board. These openings and holes may be aligned to accept a fastener that may securely fix the interposer to the main-logic board. This may provide a secure and reliable connection between the interposer and the main-logic board.

Contacts on the bottom of the interposer and top of the main-logic board or other appropriate substrate may be arranged such that they form electrical connections when the openings and holes are aligned. In various embodiments of the present invention, these holes or openings may extend completely through an interposer or main-logic board, though in other embodiments, such holes or openings may only be partially through an interposer or main-logic board.

Embodiments of the present invention may also provide connectors that are readily manufactured. In a specific embodiment of the present invention, a main-logic board having contact areas or pads and one or more holes or openings may be provided. An interposer having one or more openings to align with the one or more holes or openings in the main-logic board, as well as contacts on a bottom side arranged to mate with the contacts on the main-logic board, may be provided. The interposer may further include one or more pads or contacts on a top side, to which one or more conductors may be soldered. A shield may be fixed to the top of the interposer. The one or more openings in the interposer may be aligned to the one or more holes or openings in the main-logic board. Fasteners may be placed in the holes and openings, and the interposer may be secured to the main-logic board.

Embodiments of the present invention may also provide connectors that are well-suited to handling high-speed signals. A specific embodiment of the present invention may provide a shield to at least partially cover a top of an interposer connector. This shield may have an opening to accept one or more conductors. The shield may cover a top of the interposer connector including an area where the conductors are connected to pads or contacts. The shield may be soldered or otherwise connected to ground pads or contacts on the top of the interposer connector. These ground pads or contacts may connect to a ground on the main-logic board. This arrangement may provide a shield around one or more signal paths, thereby improving high-speed performance. Such shields may also provide mechanical support, for example, to prevent bowing of an interposer connector after it has been attached to a main-logic board.

Various embodiments of the present invention may incorporate one or more of these and the other features described herein. A better understanding of the nature and advantages of the present invention may be gained by reference to the following detailed description and the accompanying drawings.

DESCRIPTION OF ILLUSTRATIVE EMBODIMENTS

Figure 1:
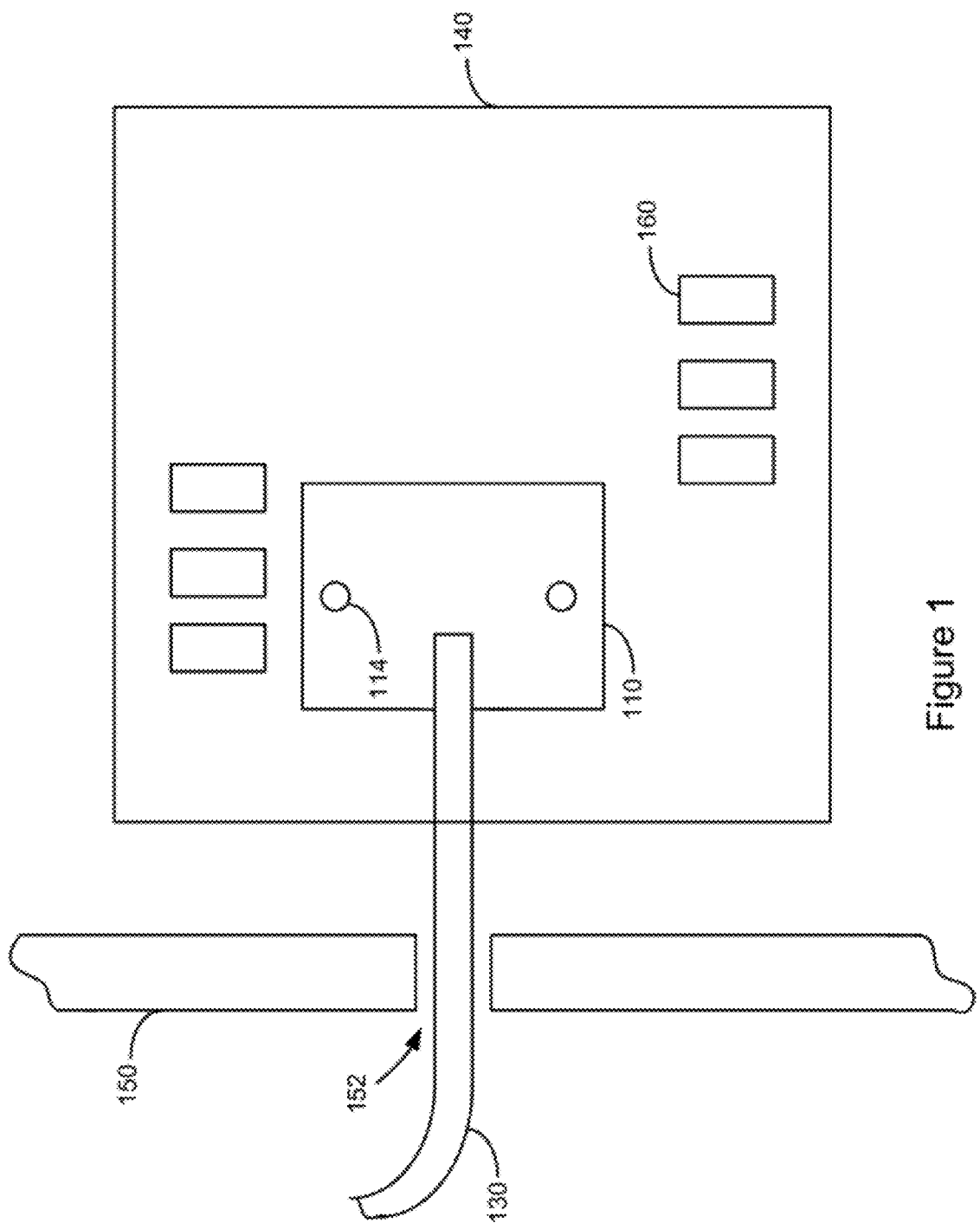
FIG. 1 illustrates a signal path according to an embodiment of the present invention.

FIG. 1 illustrates a signal path according to an embodiment of the present invention. This figure, as with the other included figures, is shown for illustrative purposes and does not limit either the possible embodiments of the present invention or the claims.

The signal path provided by this illustrative embodiment of the present invention may provide a connection between conductors (not shown) in cable 130 and traces (now shown) on board 140. Cable 130 may enter an electronic device via opening 152 in housing 150. Cable 130 may be secured in opening 152 by a strain relief (not shown). Cable 130 may attach to a top side of interposer 110. Interposer 110 may in turn attach to board 140. Interposer 110 may be attached to board 140 using fasteners 114. Board 140 may include other devices, apparatus, circuits, and components, such as devices 160.

More specifically, cable 130 may include one or more conductors (not shown). These conductors may convey power, ground, data, status, control, bias, or other types of signals or voltages. Cable 130 may provide these signals and power to an electronic device enclosed by device enclosure 150. The electronic device may be a portable computing device, tablet, desktop on one computer, cell, smart, or media phone, storage device, portable media player, navigation system, monitor, or other device. Cable 130 may be a coaxial cable, it may be a cable providing a number of conductors for an interface, such as a Universal Serial Bus (USB), High-Definition Multimedia Interface (HDMI), Digital Visual Interface (DVI), DisplayPort, Thunderbolt, or other type of interface. The one or more conductors in cable 130 may attach to contacts (not shown) on a top side of interposer 140. These contacts may be areas of metal. For example, they may be gold-plated areas. Contacts on a top side of interposer 110 may connect to contacts (not shown) on a bottom side of interposer 110. Contacts on the bottom side of interposer 110 may also be areas of metal. Alternatively, these contacts may be formed of one or more spring-like contacts. Contacts on a bottom side of interposer 110 may mate with contacts on board 140. Contacts on board 140 may connect to traces (not shown), which may in turn connect to devices, apparatus, circuitry, and components, such as devices 160. Interposer 110 may be fastened to board 140 using fasteners 114. Fasteners 114 may be bolts, screws, or other types of fasteners. Board 140 may be a main-logic board, mother board, flexible circuit board, or other appropriate substrate.

Embodiments of the present invention may provide a signal path that may be easily manufactured and highly reliable. For example, conductors in cable 130 may need to only attach to interposer 110. This may avoid the need to connect conductors in cable 130 directly to board 140. Such connections may be troublesome in that they may be difficult to form and often have a low yield. This may mean that finished products may need to be reworked, which is time-consuming and expensive. It may be much easier to rework a bad connection between cable 130 and interposer 110 than it would be to rework a bad connection between cable 130 and board 140. Also, if a bad connection cannot be reworked, it may be much cheaper to discard cable 130 and interposer 110 than it would be to discard cable 130 and board 140. This may be particularly true if components 160 are expensive.

Figure 2:
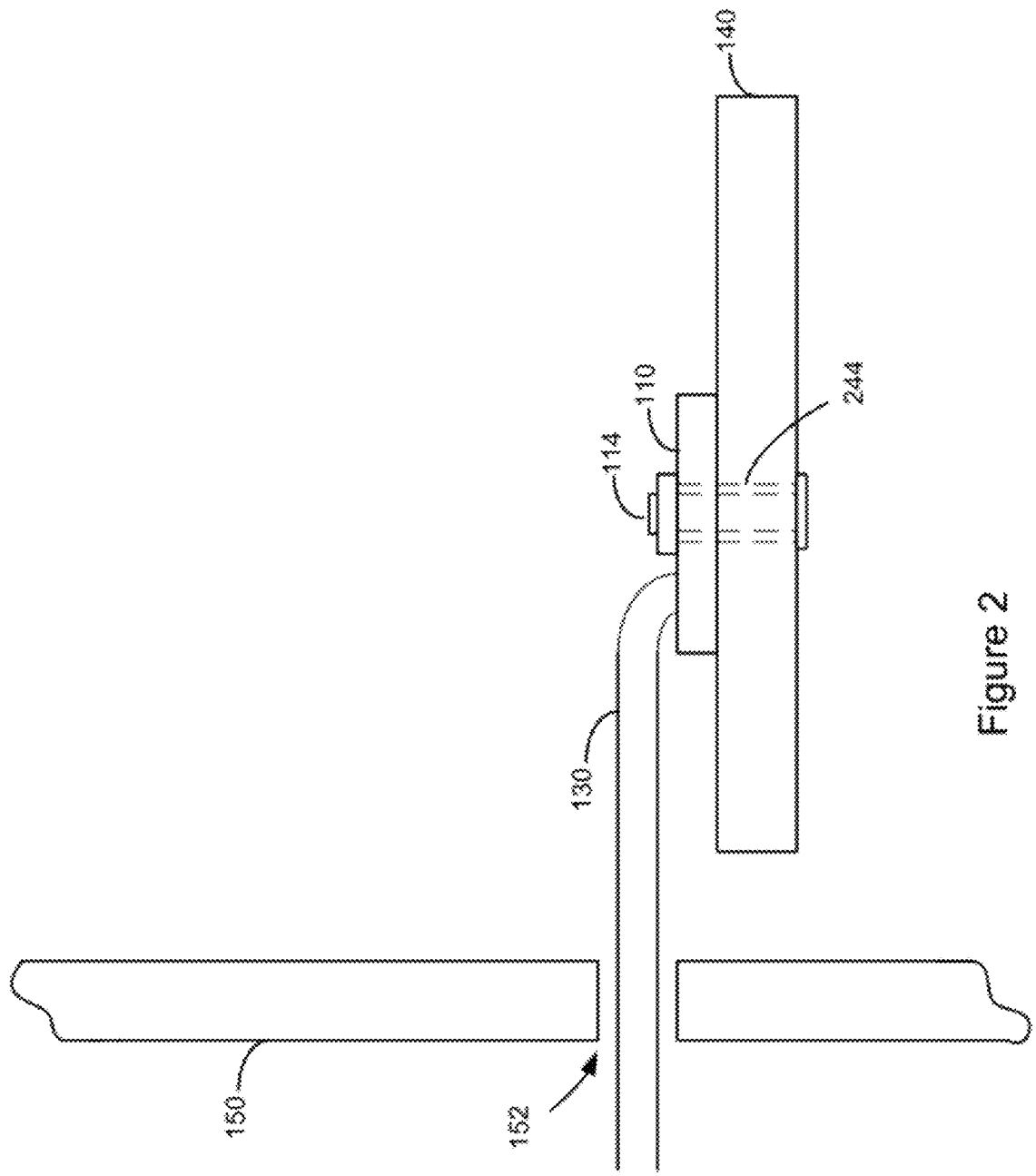
FIG. 2 illustrates a side view of a signal path according to an embodiment of the present invention.

FIG. 2 illustrates a side view of a signal path according to an embodiment of the present invention. Again, cable 130 may enter an electronic device enclosed by device enclosure 150 via opening 152. One or more conductors in cable 130 may attach to a top side of interposer 110. Interposer 110 may reside on board 140. Interposer 110 and board 140 may be attached using one or more fasteners 114. One or more fasteners 114 may be inserted in openings 244 in interposer 110 and board 140.

Embodiments of the present invention may also provide a well-shielded path from cable 130 to board 140. In various embodiments of the present invention, a shield may be placed over a top side of interposer 110. An example is shown in the following figure.

Figure 3:
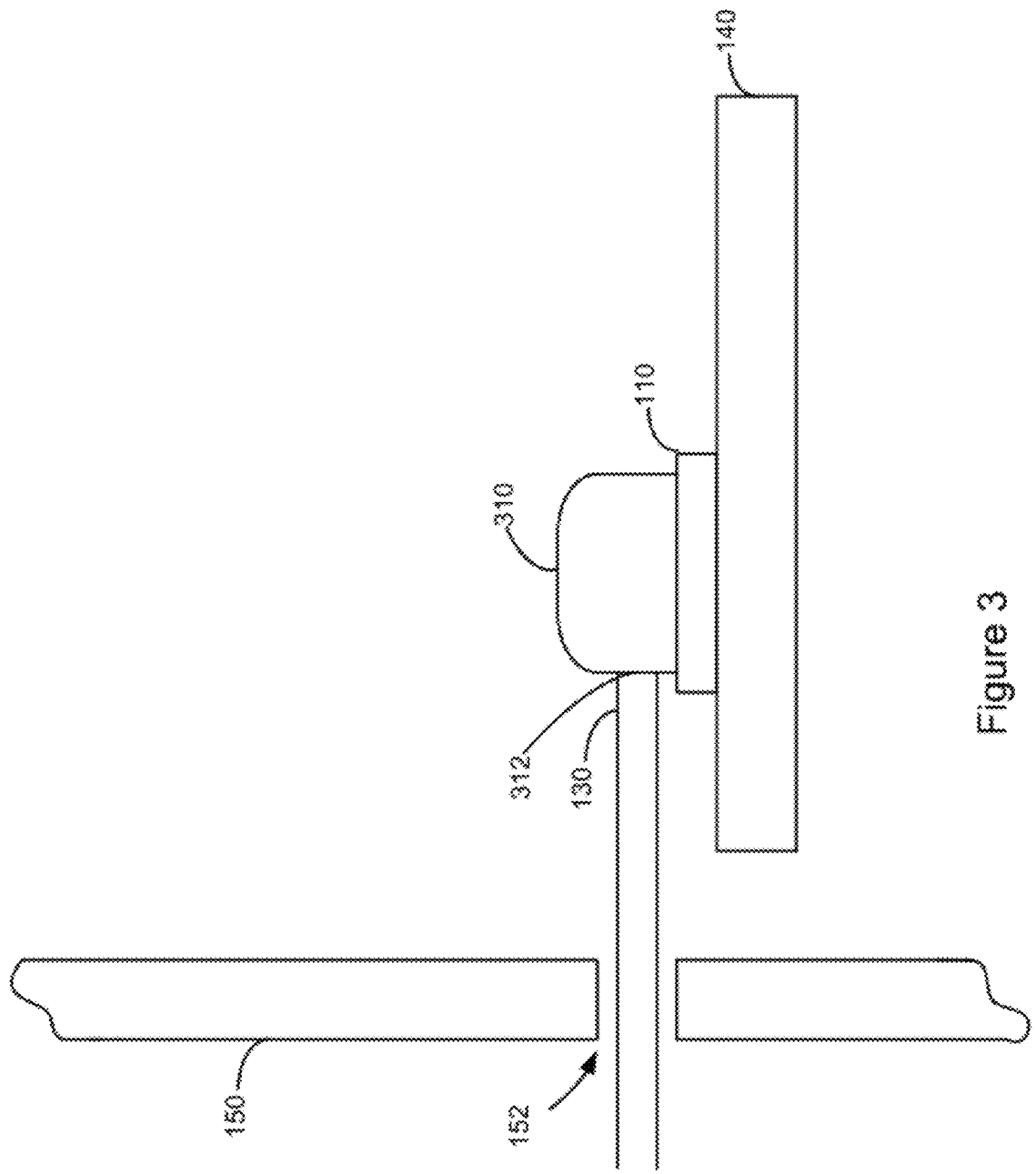
FIG. 3 illustrates a side view of a signal path according to an embodiment of the present invention.

FIG. 3 illustrates a side view of a signal path according to an embodiment of the present invention. In this example, a shield 310 may be placed over a top of interposer 110. Shield 310 may include an opening 312. Some or all of a number of conductors in cable 130 may enter shield 310 via opening 312.

Again, cable 130 may enter device enclosure 150 through opening 152. Some or all of a number of conductors in cable 130 may enter shield 310 using opening 312. One or more conductors in cable 130 may attach to contacts on a top side of interposer 110. Contacts on a top side of interposer 110 may connect to contacts on a bottom side of interposer 110. Contacts on a bottom side of interposer 110 may in turn connect to contacts on a top side of board 140. In this way, signals in the illustrated signal path may be well-shielded. Specifically, a conductor carrying a signal may be shielded in cable 130. This conductor may be further shielded inside shield 310. Contacts on a top side of interposer 110 may be at least partly surrounded by contacts connected to shield 310 on a top side of interposer 110. These contacts on the top side of interposer 110 may connect to contacts on a bottom side of interposer 110, which may connect to contacts on board 140. Contacts on board 140 may connect to traces (not shown), which may in turn connect to devices, apparatus, circuitry, and components, such as devices 160 in FIG. 1. The contacts and shield 310 may be connected to ground, either through cable 130, board 140, or both.

In various embodiments of the present invention, shield 310 may attach to a top side of interposer 110 in various ways. For example, in some embodiments of the present invention, shield 310 may be placed over fasteners, such as fasteners 114 shown in FIG. 1. In other embodiments the present invention, shield 310 may be placed inside fasteners, such as fasteners 110 shown in FIG. 1. In still other embodiments of the present invention, fasteners may be used to attach shield 310 to interposer 110 and board 140.

In various embodiments of the present invention, shield 310 may be soldered to contacts on a top side of interposer 110. In other embodiments of the present invention, other metallic areas may be provided on a top side of interposer 110, and shield 310 may soldered to these. In still other embodiments of the present invention, adhesives, such as glue, or other fasteners, may be used to attach shield 310 to interposer 110.

Shield 310 may also be arranged to provide stiffness to interposer 110. That is, shield 310 may be used to prevent or reduce bowing that may result in interposer 110 when interposer 110 is attached to board 140. That is, when interposer 110 is attached to board 140, interposer 110 may bow. This bowing may lift contacts on a bottom side of interposer 110 away from corresponding contacts on board 140, thereby disconnecting electrical paths between contacts on a bottom side of interposer 110 and contacts on board 140. In various embodiments of the present invention, a shield may provide added strength to interposer 110, thereby reducing or eliminating the bowing of interposer 110, and thus preventing disconnections of electrical paths between contacts on a bottom side of interposer 110 and contacts on board 140.

Again, embodiments of the present invention may include a board, such as a main-logic board, having a number of contacts on a top surface. An example is shown in the following figure.

Figure 4:
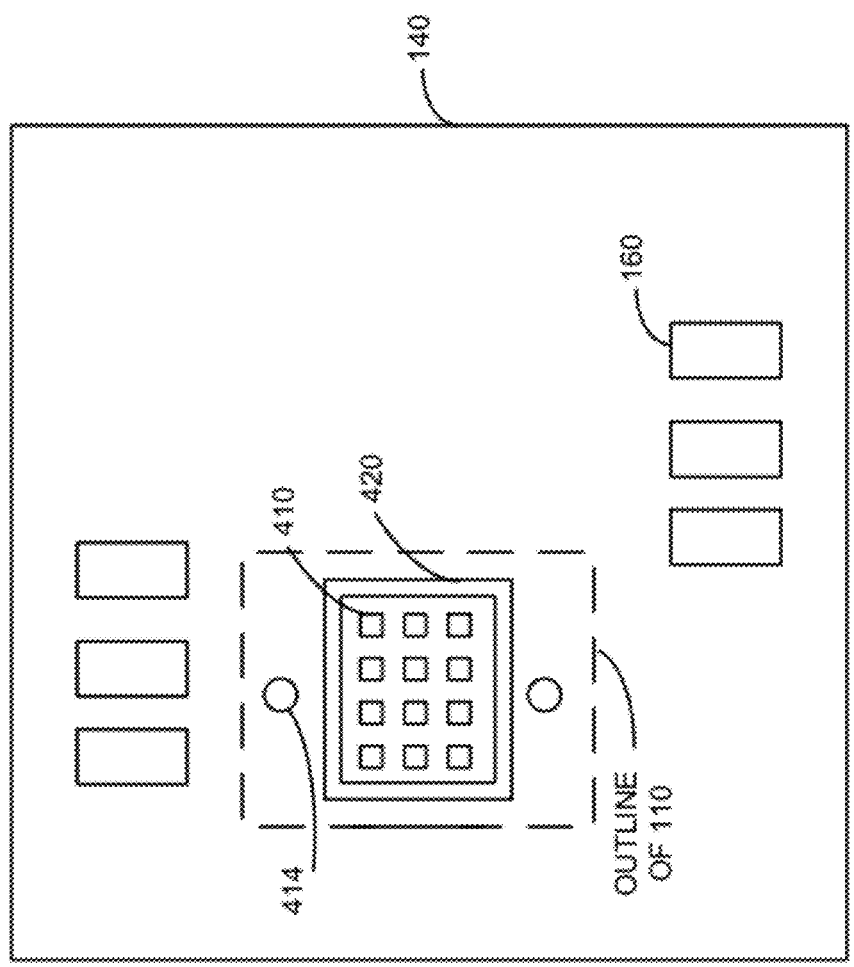
FIG. 4 illustrates a top side of a board according to an embodiment of the present invention.

FIG. 4 illustrates a top side of a board according to an embodiment of the present invention. Board 140 may include an area, shown as an outline of interposer 110, that may be arranged to mate with an interposer. This area may include one or more openings 414 for accepting fasteners, such as fastener 114. This area may also include one or more pads 410. A ground ring 420 may also be included. Ground ring 420 may be a solid ring, or it may be a number of smaller ground pads. Ground ring 420 may be inside openings 414, or ground ring 420 may be routed such that openings 414 are inside ground ring 420.

Openings 414 may extend through board 140. In other embodiments of the present invention, openings 414 may not extend through board 140. Board 140 may include one or more other apparatus, circuits, or devices, such as devices 160.

Embodiments of the present invention may also provide an interposer having openings and contacts on a bottom side arranged to mate with contacts 410 and ground ring 420. An example is shown in the following figure.

Figure 5:
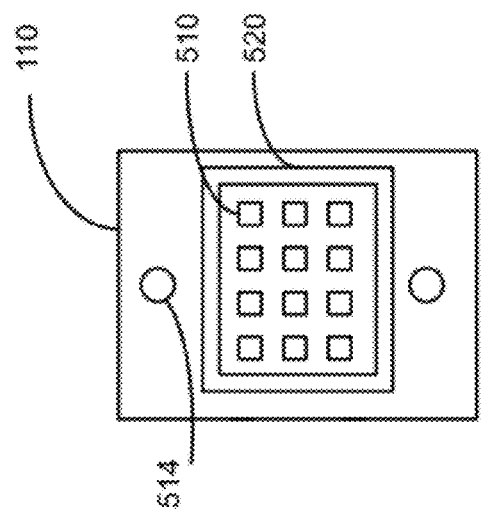
FIG. 5 illustrates bottom side of interposer according to an embodiment of the present invention.

FIG. 5 illustrates a bottom side of interposer 110 according to an embodiment of the present invention. Again, interposer 110 may include one or more openings 514. Openings 514 may be arranged to align to openings 414 in board 140. The bottom side of interposer 110 may also include pads 510 and ground ring 520. These pads 510 and ground rings 520 may be arranged to mate with pads 410 and ground rings 420 on board 140.

In various embodiments of the present invention, contacts 510 and 520 may be formed of one or more spring-like contacts. By using spring-like contacts, a tension or force may be applied between contacts on a bottom side of interposer 110 and contacts on a top side of board 140. This tension or force may help to provide a reliable electrical connection between conductors in cable 130 and board 140, and more specifically between contacts 510 on a bottom side of interposer 110 and contacts 410 on a top side of board 140. An example of such spring-like contacts is shown in the following figure.

Figure 6:
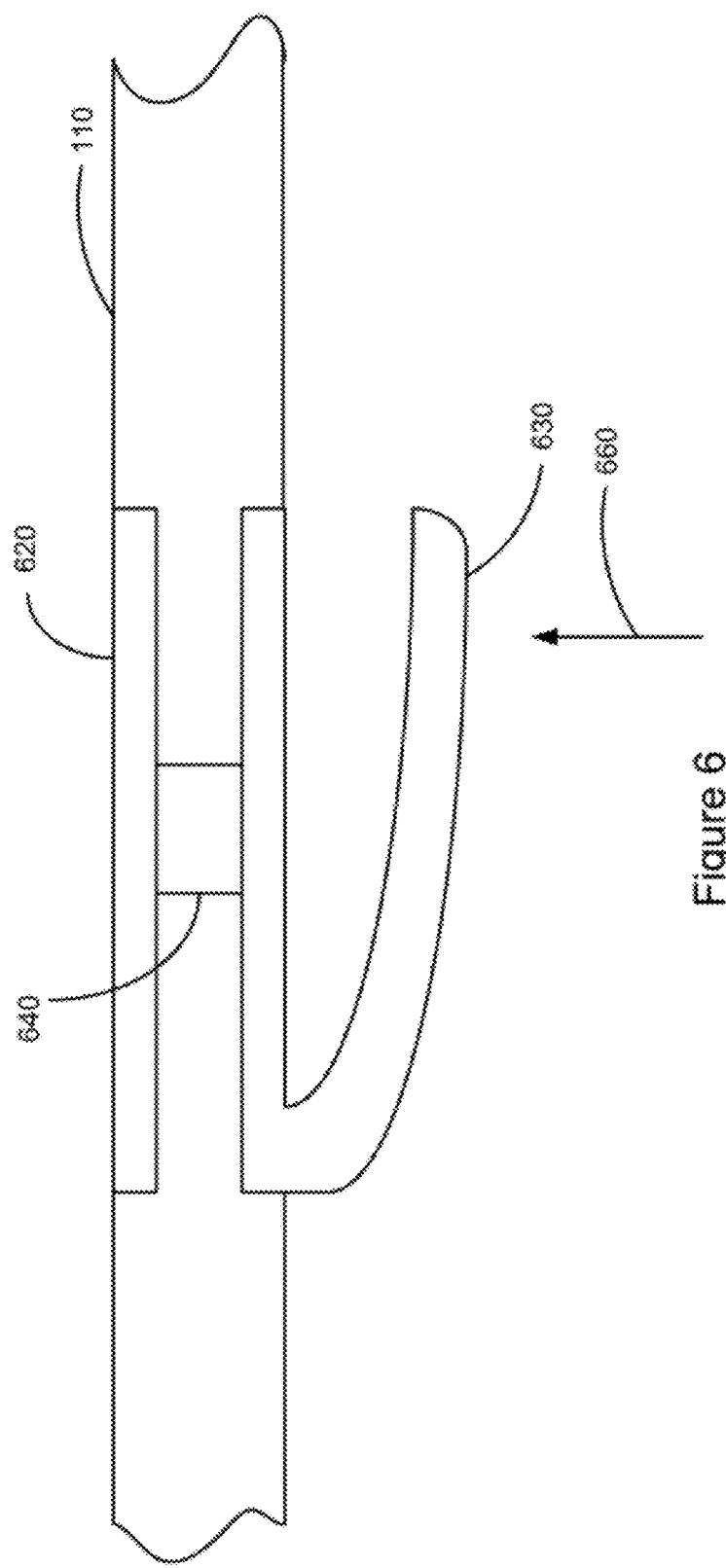
FIG. 6 illustrates a side view of a portion of interposer according to an embodiment of the present invention.

FIG. 6 illustrates a side view of a portion of interposer 110 according to an embodiment of the present invention. In this example, a bottom side contact is formed of one or more spring-like contacts 630. As interposer 110 is fixed to a board (not shown) in a downward direction, an upward force 660 compresses spring 630. This, in turn, ensures that spring 630 is engaged with a contact on board 140. Contacts 630 may connect to a contact 620 on a top side of interposer 110 through path 640.

Figure 7:
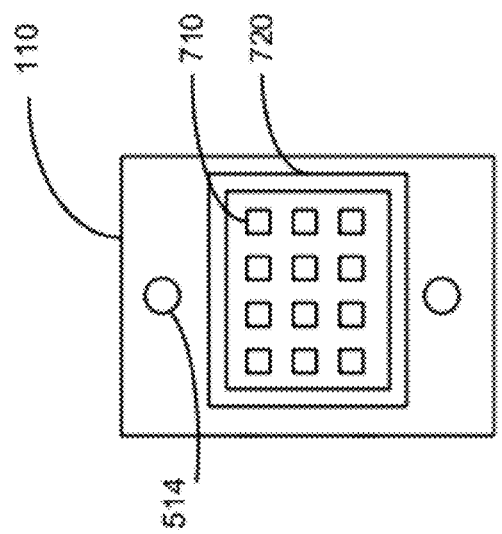
FIG. 7 illustrates a top view of an interposer according to an embodiment of the present invention.

FIG. 7 illustrates a top view of an interposer 110 according to an embodiment of the present invention. As before, interposer 110 may include one or more holes 514. A top side of interposer 110 may include a number of pads 710 and one or more ground rings 720. A shield (not shown) may be soldered or otherwise fixed to interposer 110 using ground ring 720. Conductors in cable 130 may be soldered to one or more pads 710. Shielding or braiding in cable 130 may connect to one or more contacts or pads 710, ground ring 720, or other appropriate contacts.

In this example, a shield having a footprint at least similar to ground ring 720 may be attached to a top side of interposer 110. In this example, openings 514 are outside of a shield area. In other embodiments of the present invention, openings 514 may be inside the shield area. In such a case, interposer 110 may need to be attached to board 140 before this shield is attached to the top of interposer 110, otherwise the shield may cover openings 514 and prevent insertion of fasteners. In still other embodiments of the present invention, a shield 310, interposer 110, and board 140, may each having openings or holes arranged to align, and a fastener may be used in one or more such aligned holes to secure or otherwise fix the shield 310, interposer 110, and board 140 together.

Again, embodiments of the present invention may provide an interposer connector that is readily manufactured. An example is shown in the following figure.

Figure 8:
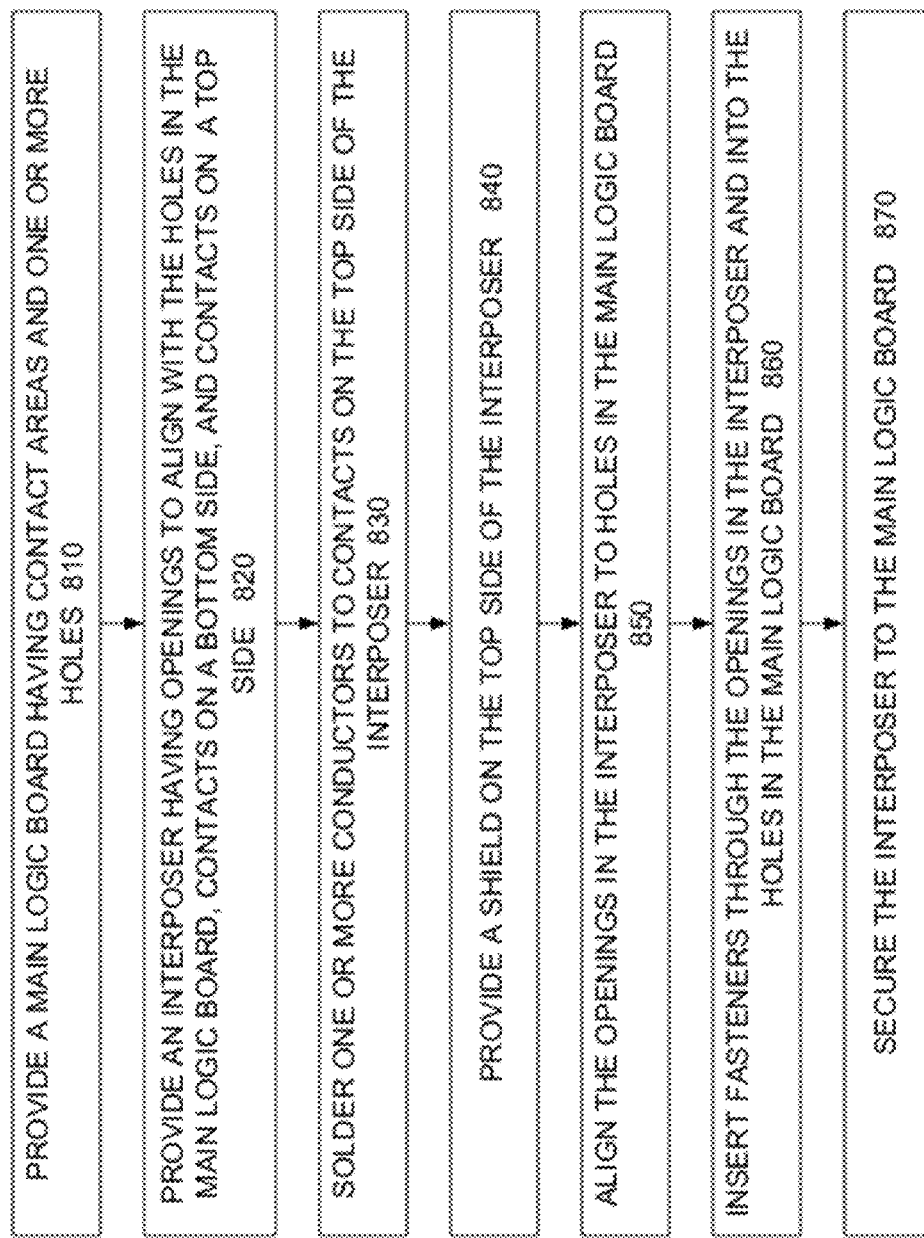
FIG. 8 illustrates a method of manufacturing an interposer connector according to an embodiment of the present invention.

FIG. 8 illustrates a method of manufacturing an interposer connector according to an embodiment of the present invention. In act 810, a main-logic board having contact areas and one or more holes is provided. In act 820, an interposer having openings to align with holes in the main-logic board, contacts on a bottom side, and contacts on a top side, may be provided. In act 830, one or more conductors in a cable may be soldered or otherwise attached to contacts on a top side of interposer in act 830. A shield may be provided on the top side of interposer in act 840. In act 850, openings or holes in interposer may be aligned to openings or holes of the main-logic board. Fasteners may be inserted in the openings or holes of interposer and into the openings or holes in main-logic board in act 860. In act 870, fasteners may be used to secure the interposer to the main-logic board.

In other embodiments of the present invention, the sequence of these acts may be varied. For example, the interposer may be fixed to the main-logic board using fasteners that are covered by a shield. In this example, the interposer may be secured to the main-logic board before a shield is attached to the top side of the interposer. In still other embodiments of the present invention, the fasteners may join a shield, interposer, and main-logic board together. In such embodiments, a shield may have one or more openings or holes to align with or correspond to openings or holes in the interposer and board. A fastener may be placed in each of the aligned holes to secure the shield, interposer, and board together as a unit.

Again, in other embodiments of the present invention, other types of fasteners besides of screws and threaded bosses may be used. An example is shown in the following figures.

Figure 9:
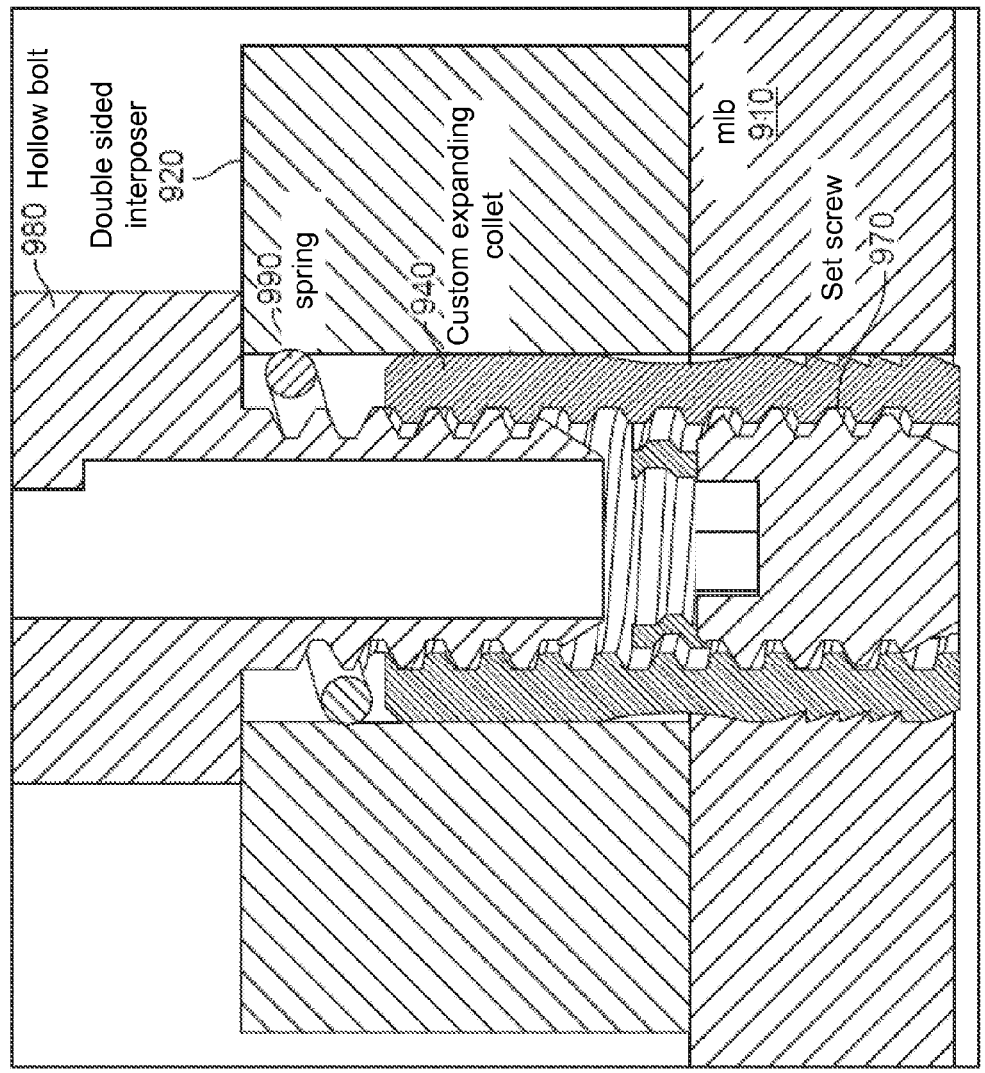
FIG. 9 illustrates another cross section of an interposer and main-logic board aligned and fastened together according to an embodiment of the present invention.

FIG. 9 illustrates another cross section of an interposer and main-logic board aligned and fastened together according to an embodiment of the present invention. In this example, an opening in mother or main-logic board 910 is aligned with an opening in interposer 920. The opening in mother or main-logic board 910 may extend through the main-logic board 910 as a through hole, or the opening may stop partially through main-logic board 910 as a blind hole. Expanding collet 940 may be placed through these openings. Set screw 970 may be used to fasten collet 940 to main-logic board 910. Bolt 980 may be used to secure interposer 920 and main-logic board 910.

In a specific embodiment of the present invention, set screw 970 and bolt 980 may be inserted into collet 940 at the same time. Specifically, set screw 970 may have a threaded or notched top surface for accepting a tool. Bolt 980 may be hollow to allow insertion of the tool into set screw 970. This tool may also turn bolt 980 into place, though a separate tool and separate assembly step may be used to insert bolt 980. Spring 990 may be used to increase contact pressure and maintain mechanical stability.

Figure 10:
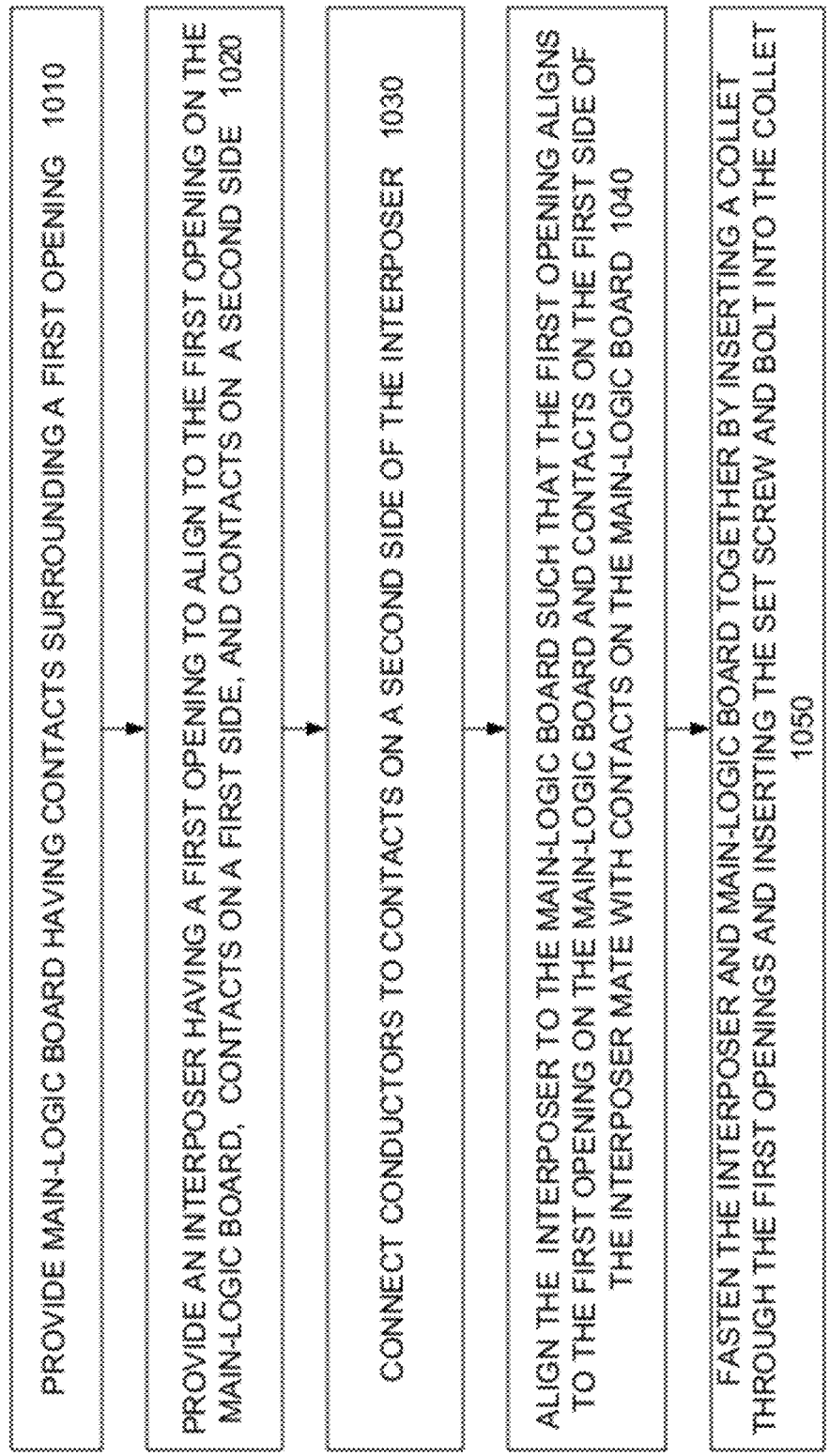
FIG. 10 is another flow chart of a method of assembling an interposer and main-logic board according to an embodiment of the present invention.

FIG. 10 is another flow chart of a method of assembling an interposer and main-logic board according to an embodiment of the present invention. In act 1010, a main-logic board having contacts around a first opening is provided. An interposer having a first opening to align the first opening on the main-logic board, contacts on a first side, and contacts on a second side, is provided in act 1020. In act 1030, conductors are attached to contacts on the second side of the interposer.

In act 1040, the interposer may be aligned to the main-logic board such that the first opening aligns to the first opening on the main-logic board and contacts on a first side of interposer mate with contacts on the main-logic board. The interposer and main-logic board may be secured by inserting a collet through the first openings and a set screw and bolt may be inserted into the collet in act 1060.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A connector comprising:
    an interposer having a plurality of openings for accepting a corresponding plurality of fasteners, the interposer further comprising:
        a first plurality of contacts on a top side; and
        a second plurality of contacts on a bottom side, the first plurality of contacts each coupled to at least one of the second plurality of contacts, wherein each of the second plurality of contacts comprises a plurality of spring-like contacts; and
    a shield attached to the top side of the interposer, the shield having an opening for at least one conductor,
    wherein the shield is soldered to the top side of the interposer.

2. The connector of claim 1 wherein the plurality of openings comprises two openings at opposing ends of the interposer.

3. The connector of claim 1 wherein the first plurality of contacts each comprise a gold-plated pad.

4. The connector of claim 1 wherein the shield is soldered to at least one of the first plurality of contacts on the top side of the interposer.

5. The connector of claim 1 wherein the shield provides mechanical support to prevent bowing of the interposer when the connector is attached to a board.

6. The connector of claim 1 wherein the opening in the shield is formed to fit a coaxial cable.

7. A connector comprising:
    an interposer having a plurality of openings for accepting a corresponding plurality of fasteners, the interposer further comprising:
        a first plurality of contacts on a top side; and
        a second plurality of contacts on a bottom side, the first plurality of contacts each coupled to at least one of the second plurality of contacts, wherein each of the second plurality of contacts comprises a plurality of spring-like contacts; and
    a shield attached to the top side of the interposer, the shield having an opening for at least one conductor,
    wherein the opening in the shield is formed to fit a cable comprising a plurality of conductors, each of the plurality of conductors soldered to at least one of the first plurality of contacts on the top side of the interposer.

8. The connector of claim 7 wherein the shield is soldered to at least one of the first plurality of contacts on the top side of the interposer.

9. The connector of claim 7 wherein the shield provides mechanical support to prevent bowing of the interposer when the connector is attached to a board.

10. The connector of claim 7 wherein the opening in the shield is formed to fit a coaxial cable.

11. A method of forming a signal path comprising:
    receiving a main-logic board having a first plurality of contacts and one or more openings;
    receiving an interposer having one or more openings to align with the one or more openings in the main-logic board, a second plurality of contacts on a bottom side arranged to mate with the first plurality of contacts on the main-logic board, and a third plurality of contacts on a top side;
    attaching at least one conductor to one of the third plurality of contacts on the top side of the interposer;
    attaching a shield to the top side of the interposer; and
    fastening the interposer to the main-logic board,
    wherein attaching a shield to the top side of the interposer comprises:
        soldering the shield to at least one of the third plurality of contacts.

12. The method of claim 11 wherein fastening the interposer to the main-logic board comprises:
    aligning the one or more openings in the interposer to the one or more openings in the main-logic board; and
    inserting a fastener in each of the one or more openings in the interposer.

13. The method of claim 11 wherein fastening the interposer to the main-logic board comprises:
   inserting a threaded insert into each of the openings in the main-logic board;
   aligning the one or more openings in the interposer to the one or more openings in the main-logic board; and
   inserting a fastener in each of the threaded inserts.

14. The method of claim 11 wherein each of the second plurality of contacts are formed of a plurality of spring-like contacts.

15. A method of forming a signal path comprising:
   receiving a main-logic board having a first plurality of contacts and one or more openings;
   receiving an interposer having one or more openings to align with the one or more openings in the main-logic board, a second plurality of contacts on a bottom side arranged to mate with the first plurality of contacts on the main-logic board, and a third plurality of contacts on a top side;
   attaching at least one conductor to one of the third plurality of contacts on the top side of the interposer;
   attaching a shield to the top side of the interposer; and
   fastening the interposer to the main-logic board,
   wherein the conductor is a conductor for a coaxial cable.

16. A method of forming a signal path comprising:
   receiving a main-logic board having a first plurality of contacts and one or more openings;
   receiving an interposer having one or more openings to align with the one or more openings in the main-logic board, a second plurality of contacts on a bottom side arranged to mate with the first plurality of contacts on the main-logic board, and a third plurality of contacts on a top side;
   attaching at least one conductor to one of the third plurality of contacts on the top side of the interposer;
   attaching a shield to the top side of the interposer; and
   fastening the interposer to the main-logic board,
   wherein the conductor is a conductor in a cable comprising a plurality of conductors.

17. A signal path comprising:
   at least one conductor;
   an interposer having a plurality of openings, a plurality of contacts on a top side, the conductor soldered to at least one of the plurality of contacts on the top side, and a plurality of contacts on a bottom side, the plurality of contacts on a bottom side each comprising a plurality of spring-like contacts;
   a board comprising a plurality of openings arranged to align with the plurality of openings in the interposer and a plurality of contacts arranged to align and form electrical connections with the plurality of contacts on the bottom side of the interposer;
   a shield on the top side of the interposer, the shield soldered to at least one of the plurality of contacts on the top of the interposer; and
   a plurality of fasteners, each fastener in one of the plurality of openings in the interposer and one of the plurality of openings in the board, wherein the plurality of fasteners mechanically attach the interposer and the board.

18. The signal path of claim 17 wherein the conductor is a conductor for a coaxial cable.

19. The signal path of claim 17 wherein the conductor is a conductor in a cable comprising a plurality of conductors.

20. The signal path of claim 17 wherein each of the fasteners comprises a bolt.

21. The signal path of claim 17 wherein each of the fasteners comprises a screw.

\* \* \* \* \*